US011990926B2

United States Patent
Briffa et al.

(10) Patent No.: US 11,990,926 B2
(45) Date of Patent: May 21, 2024

(54) SYSTEMS AND RELATED TECHNIQUES FOR EFFICIENT OPERATION OF A CELLULAR NETWORK

(71) Applicant: TalkingHeads Wireless, Inc., Roslindale, MA (US)

(72) Inventors: Mark A. Briffa, Tyreso (SE); Joel L. Dawson, Roslindale, MA (US)

(73) Assignee: TalkingHeads Wireless, Inc., Roslindale, MA (US)

( * ) Notice: Subject to any disclaimer, the term of this patent is extended or adjusted under 35 U.S.C. 154(b) by 22 days.

(21) Appl. No.: 17/525,392

(22) Filed: Nov. 12, 2021

(65) Prior Publication Data

US 2022/0149874 A1 May 12, 2022

Related U.S. Application Data

(60) Provisional application No. 63/112,534, filed on Nov. 11, 2020, provisional application No. 63/112,515, filed on Nov. 11, 2020, provisional application No. 63/112,526, filed on Nov. 11, 2020, provisional application No. 63/112,542, filed on Nov. 11, 2020.

(51) Int. Cl.
*H04B 1/04* (2006.01)
*H03F 3/24* (2006.01)
*H04B 1/12* (2006.01)
*H04W 52/24* (2009.01)
*H04W 88/08* (2009.01)

(52) U.S. Cl.
CPC ........... *H04B 1/0483* (2013.01); *H03F 3/245* (2013.01); *H04W 52/241* (2013.01); *H03F 2200/451* (2013.01); *H04B 2001/045* (2013.01); *H04W 88/085* (2013.01)

(58) Field of Classification Search
None
See application file for complete search history.

(56) References Cited

U.S. PATENT DOCUMENTS

| | | | | |
|---|---|---|---|---|
| 2010/0248660 A1* | 9/2010 | Bavisi | ................... | H04B 1/0458 455/120 |
| 2016/0315719 A1* | 10/2016 | Jian | .......................... | G01R 21/10 |
| 2018/0062606 A1* | 3/2018 | Lim | ........................... | H03H 7/40 |

* cited by examiner

*Primary Examiner* — Pablo N Tran
(74) *Attorney, Agent, or Firm* — Daly, Crowley, Mofford & Durkee, LLP

(57) ABSTRACT

Described are concepts, systems and techniques for detecting whether an antenna is connected to a transmit system to thereby protect a power amplifier lineup from damage.

8 Claims, 11 Drawing Sheets

SYSTEMS AND RELATED TECHNIQUES FOR EFFICIENT OPERATION OF A CELLULAR NETWORK

RELATED APPLICATIONS

This application claims the benefit under 35 U.S.C. § 119(e) of provisional application No. 63/112,515 filed on Nov. 11, 2020; provisional application No. 63/112,534 filed on Nov. 11, 2020; provisional application No. 63/112,526 filed on Nov. 11, 2020; and provisional application No. 63/112,542 filed on Nov. 11, 2020 all of which are hereby incorporated herein by reference in their entireties.

BACKGROUND

As is also known in the art The increase in the number and use of mobile communication networks (e.g. cellular networks) has led to a corresponding increase in the power consumption of mobile communication networks.

As is also known in the art, many modern wireless systems commonly utilize so-called distributed base stations which comprise a base station and one or more remote radio heads (RRHs). In such distributed base stations the radio equipment contained in the RRH which is remote from a base station. An RRH may contain, for example, the base station's RF circuitry plus analog-to-digital/digital-to-analog converters and up/down converters. RRHs also have operation and management processing capabilities and an interface to couple to the remaining portions of the base station.

As is also known, RRHs often utilize multiple antennas (e.g. multiple-input multiple output or MIMO) systems. The use of multiple antennas in RRHs is done for a variety of reasons such as to provide protection against signal fading and to allow use of beamforming techniques which may improve performance characteristics of a wireless system.

As is known, power amplifiers (PAs) coupled to remote radio heads (RRHs) can be severely damaged by turning on the heads (i.e. supplying RF power to a transmit signal path in the RRH) when one or more antennas are not connected.

SUMMARY

In accordance with one aspect of the concepts, systems and techniques described herein, described is a mechanical means for detecting whether an antenna is electrically and/or mechanically connected to an antenna port of a remote radio head (RRH). Such mechanical means protect the PA (or a series of PAs or a PA lineup) from damage by disabling or otherwise preventing the RRH from powering on and/or by alerting a controller in the RRH that or more antennas is not coupled to an antenna port of an RRH. Such mechanical means of detecting may thus lower the risk of operating an RRH with a substantially open circuit impedance (also sometimes referred to herein simply as an open connection) at the antenna port of the RRH.

Furthermore, in many systems, a circulator (or other protection circuit) coupled between the PA and the antenna. A circulator is a magnetic RF component coupled between an output port of a PA and the antenna and protects the PA from exposure to excess power reflected back to the PA output port. Such a reflection of power may be caused, for example, by a high voltage standing wave ratio (VSWR) condition (such as may be caused by an open circuit impedance) existing at an antenna port of an RRH. Thus, inclusion of mechanical means of detecting an unconnected antenna at and RRH antenna port may also allow relaxation of requirements (e.g. power handling requirements) of a circulator (or other protection circuit) coupled between the PA output port and an antenna.

Thus, at least some benefits of including a mechanical means of detecting whether an antenna is electrically and/or mechanically connected to an RRH antenna port, include, but are not limited to, relaxing the requirements of a circulator (e.g. technical and/or design requirements of a circulator) coupled between a PA output port and an antenna may enable lowering the insertion loss of the circulator.

Lowering the insertion loss of a circulator in a transmit signal path, in turn, raises the efficiency of the RF transmit signal path, and thus reduces the need for heatsinks in the RRH. Since high bandwidth in RF systems typically leads to low efficiencies, this results in RRHs that are large, heavy, and expensive to operate. Thus utilization of mechanical means of detecting whether an antenna is electrically and/or mechanically connected to an RRH antenna port results in an RRH which is smaller and lighter than RRHs used in systems which do not include a mechanical means of detecting whether an antenna is electrically and/or mechanically connected to an RRH antenna port.

Also described are additional concepts, systems and techniques which allow for high bandwidth and high capacity RRHs that are also small and light. In addition to the above use of mechanical means of detecting whether an antenna is electrically and/or mechanically connected to an RRH antenna port, achievement of RRHs that are also small and light may be further achieved by tuning each RRH power amplifier (PA) path for different center frequencies. This approach allows for coverage of wide aggregate bandwidths in a variety of deployed bands (keeping in mind that channel capacity always goes linearly with bandwidth). In embodiments, the bandwidth of each path is chosen to allow high efficiency. When few bands are deployed, there is the option to raise amplifier supply voltages (e.g. Vdds) to keep total output power high. When many bands are deployed, PA bias voltages (e.g. PA supply voltages or Vdds) can be adjusted (e.g. lowered) to keep total output power constant. In MIMO embodiments, MIMO rank is increased by adding more paths at a given frequency offset.

Moreover, in embodiments, feedback mechanisms may be used to improve cellular network performance. Some feedback mechanisms which can be used in accordance with the concepts, systems and techniques described herein include, but are not limited to: (1) real-time measurements of achieved bit rate, and effective MIMO rank (this leads to a maximally adaptable cellular network); and long-term network statistics. In embodiments, either type of feedback (or even multiple types of feedback) may be used (either individually or in combination). This may result in an increase in the overall efficiency and lower the energy consumption of an RRH over its lifetime. The results in lower operating costs.

Other feedback mechanisms which can be used include, but are not limited to: (1) real-time measurements of SNR, and/or monitoring the dynamic coding decisions made in the network that determine the peak-to-average power ratio (PAPR) for each RRH pipe; and/or long-term network statistics. Either feedback mechanism may be used individually, or these feedback mechanisms may be used in combination.

In accordance with a further aspect of the concepts, systems and techniques disclosed herein, described is an additional use of multiple antennas, namely: divide a communication channel so that no single RF power amplifier in an RRH has to carry so much bandwidth that it cannot be efficiently operated (e.g. biased in a way that the PA efficiency is relatively high compared with a maximum efficiency achievable with the PA.

In theory, the channel capacity scales linearly with the number of MIMO paths. In practice, channel capacity grows much slower (square root).

In accordance with the concepts, systems and techniques described herein, it has been recognized that frequency bandwidth is always important/critical for high-capacity networks. However, it is also recognized that high bandwidth in RF systems leads to low efficiencies. This results in RRHs that are large, heavy, and expensive to operate.

To address these issues, described are concepts, systems and techniques which allow for high frequency bandwidth and high capacity RRHs that are also small, light and relatively inexpensive compared with conventional RRHs.

This result is achieved by tuning each power amplifier (PA) path for different center frequencies, to allow for coverage of wide aggregate frequency bandwidths in a variety of deployed frequency bands (keeping in mind that channel capacity always goes linearly with bandwidth when the SNR is substantially above 0 dB). In embodiments, the bandwidth of each path is chosen to allow high efficiency operation of a PA in the RRH. When few frequency bands are deployed, there is the option to raise amplifier supply voltages (e.g. Vdds) to keep total output power high. It should be noted that in this context, "few" means that PAs tuned to certain center frequencies are turned off because the bands that they are centered for are not being used (e.g., PAs in one or more of paths 34a-34n in FIG. 7).

When many bands are deployed, PA bias voltages (e.g. PA supply voltages or Vdds) can be adjusted (e.g. lowered) to keep total output power constant. It should be noted that in this context "many" means that all or almost all of the PA paths (e.g., PAs in one or more of paths 34a-34n in FIG. 7).

In embodiments, MIMO rank is increased by adding more paths at a given frequency offset.

Some feedback mechanisms which can be used in accordance with the concepts, systems and techniques described herein include, but are not limited to: (1) real-time measurements of achieved bit rate, and effective MIMO rank (this leads to a maximally adaptable cellular network); and long-term network statistics. In embodiments, either type of feedback (or even multiple types of feedback) may be used (either individually or in combination).

Some benefits of these concepts, systems and techniques include, but are not limited to an increase in the overall efficiency and lower the energy consumption of the RRH over its lifetime. The results in lower operating costs.

Other feedback mechanisms which can be used in accordance with the concepts, systems and techniques described herein include, but are not limited to: (1) real-time measurements of SNR, and/or monitoring the dynamic coding decisions made in the network that determine the peak-to-average power ratio (PAPR) for each RRH pipe; and/or long-term network statistics. Either feedback mechanism may be used or these feedback mechanisms may be used in combination.

Based upon a measured signal-to-noise (SNR) on any given link in a cell, the upper limit of channel capacity is known (Shannon limit). Also, based upon a selected coding strategy implemented in a network and the measured SNR, the maximum realizable capacity may be determined. Furthermore, an actual achieved bit rate is known.

In accordance with the concepts described herein, it has been recognized that from these data, it can be determined how much excess SNR exists. Known performance metrics of the coding strategy tell us how much SNR are needed to achieve a certain bit rate. If the measured SNR exceeds this "needed" SNR, the difference between the two is the excess SNR. It has also been recognized that this excess SNR corresponds to an amount of excess transmitter power. That is, it is possible to maintain the same actual achieved bit rate while reducing the amount if transit power.

In accordance with a further aspect of the concepts, system and techniques described herein, in response to a known actual bit rate achieved in a cellular network, a cellular network is configured to dynamically scale a transmitted output power to an amount of transmitted output power which is substantially at or near a minimum amount of transmit power needed (ideally, at all times) to maintain an achieved bit rate.

With this particular arrangement, the power consumption of a transmit system may be reduced (or ideally minimized). In embodiments, by transmitting an output power which is substantially at or near a minimum amount of transmit power needed to maintain the known actual bit rate, power consumption of a transmit system can be reduced below the power consumption used in a conventional system. Furthermore, by transmitting an output power which is always at or near a minimum amount of transmit power needed to always maintain the known actual bit rate, the power consumption of a transmit system may be minimized.

In embodiments, the RF lineup (and in particular the RF power amplifier in a transmit system, can be dynamically scaled to keep the efficiency high. In embodiments, a transmit system may be provided as part of a transmit-receive (T/R) circuit (i.e. a soc-called T/R module).

In embodiments, by observing long-term statistics, it is possible to design a remote radio head (RRH) and/or active antennas to have a form factor which is smaller than the form factor of a conventional RRH. This is possible since, in accordance with the concepts described herein, the RRH may be designed to satisfy needs derived from observing long-term statistics, rather than always preparing for the absolute worst case. This leads to smaller (in area and/or volume), lighter RRHs.

In embodiments, one feedback mechanism utilizes real-time measurements of SNR, bit rate, and/or achieved capacity. Designing networks, systems and components in accordance with the concepts described herein leads to an adaptable cellular network and ideally leads to a maximally adaptable cellular network.

In embodiments, one feedback mechanism is feedback based upon long-term network statistics.

In embodiments, multiple feedback mechanisms can be used. For example, in embodiments, real-time measurements of SNR and/or bit rate and/or achieved capacity and/or long-term network statistics can be used. In embodiments, the some or all of the above feedback mechanisms can be used alone or can be used in combination.

Thus, systems and techniques designed, manufactured and operated in accordance with the concepts and techniques described herein address power consumption concerns without reducing quality of service in mobile communication networks.

In accordance with a still further aspect of the concepts described herein, a system for configuring a cellular network or one or more components thereof to dynamically scale a transmitted output power of a base station, the system comprising: a processor configured to: determine an actual achieved bit rate for a link in a cell of a cellular network; determine how much excess signal to noise ratio (SNR)

exists within the cellular network; determine an amount of transmitted output power substantially corresponding to an amount of transmit power needed to maintain a selected bit rate; and configure the cellular network to dynamically scale to the determined amount of transmitted output power which is substantially at or near a minimum amount of transmit power needed at all times to maintain the selected bit rate.

In embodiments, the selected bit rate is one of an achieved bit rate or a desired bit rate.

In embodiments, the processor is further configured to determine an amount of transmitted output power substantially corresponding to an amount of transmit power needed to maintain at all times a selected bit rate.

In embodiments, the selected bit rate is one of an achieved bit rate or a desired bit rate.

In accordance with a still further aspect of the concepts described herein, a method for configuring a cellular network or one or more components thereof to dynamically scale a transmitted output power to an amount of transmitted output power which is substantially at or near a minimum amount of transmit power needed at all times to maintain a desired bit rate, the method comprising: determining an actual achieved bit rate for a link in a cell of a cellular network determining how much excess signal to noise ratio (SNR) exists within the cellular network; determining an amount of transmitted output power which is substantially at or near a minimum amount of transmit power needed at all times to maintain a selected bit rate; and configuring the cellular network to dynamically scale to the determined amount of transmitted output power which is substantially at or near a minimum amount of transmit power needed at all times to maintain the selected bit rate.

In embodiments, the selected bit rate is one of an achieved bit rate or a desired bit rate.

In embodiments, the processor is configured to determine an amount of transmitted output power substantially corresponding to an amount of transmit power needed to maintain at all times a selected bit rate.

In embodiments, the selected bit rate is one of an achieved bit rate or a desired bit rate.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1:
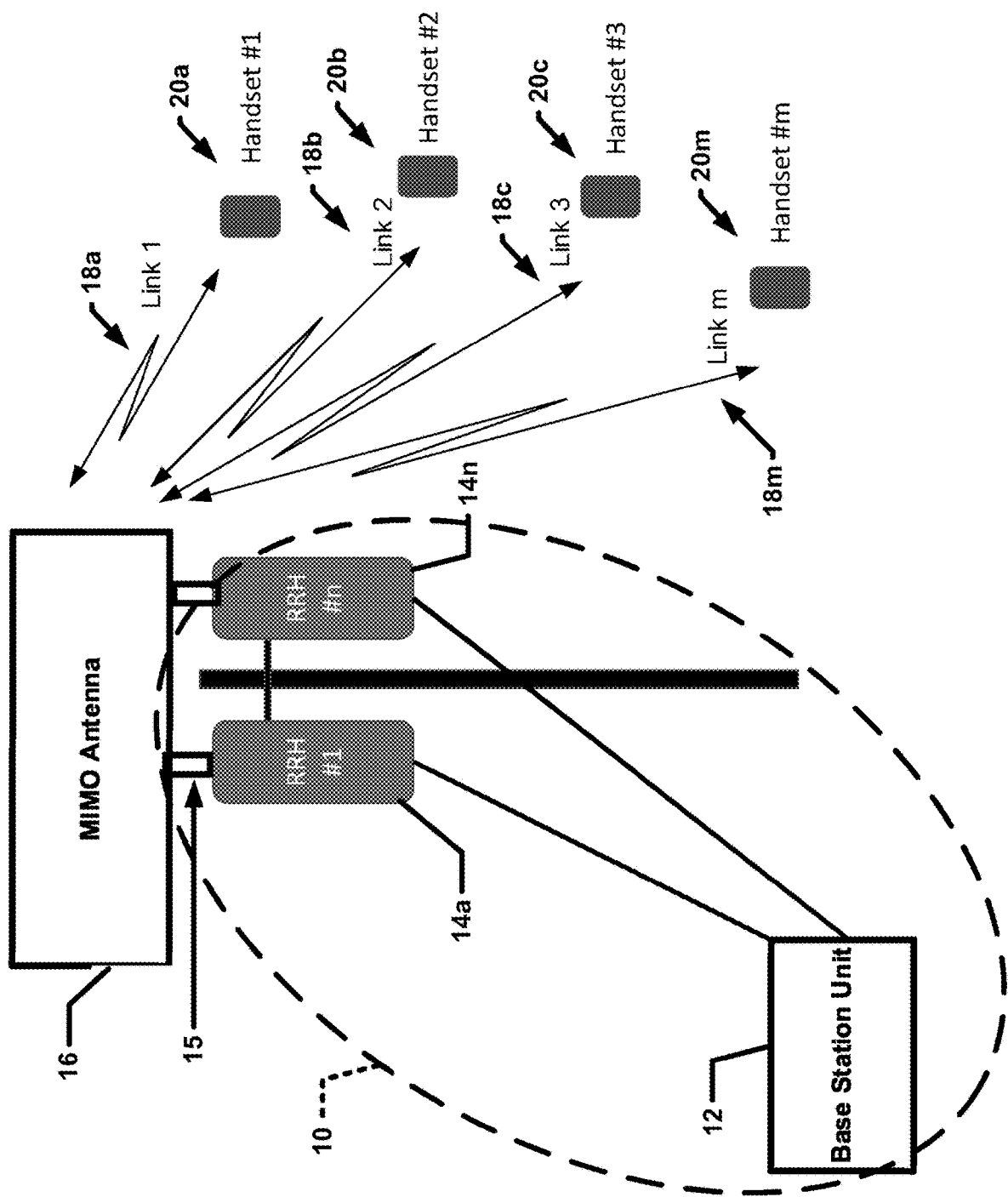
FIG. 1 is a block diagram of an example wireless communication system including a base station and one or more remote radio heads.

Referring now to FIG. 1, shown is an example cellular tower having one or more (here n) remote radio heads (RRHs) coupled thereto. Each RRH has one or more antenna coupled thereto at an RRH antenna port. A base station is in communication with the RRHs.

The RRHs may comprises one or more a transmit signal paths with each transmit signal path comprising one or more power amplifiers (PAs). The PAs can be severely damaged by turning on the heads (i.e. supplying RF power to a transmit signal path in the RRH) when one or more antennas are not connected to the RRH antenna port.

Figure 2:
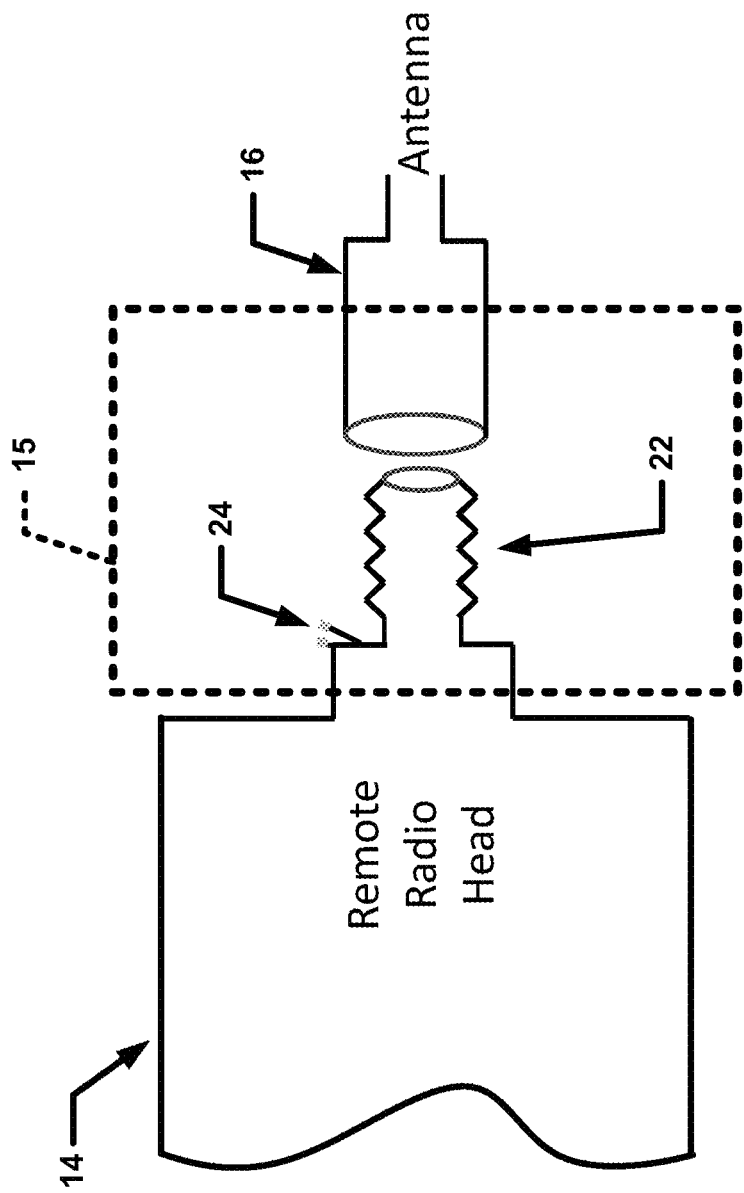
FIG. 2 is a schematic diagram of an illustrative mechanical switch having a spring-loaded contact arranged so as to provide an indication of when an antenna is coupled to a remote radio head.

To address this issue, and referring now to FIG. 2, described is a mechanical means for detecting whether an antenna is electrically and/or mechanically connected to an RRH antenna port. In the example embodiment of FIG. 2, the means comprises a spring-loaded contact switch which provides a signal path having a substantially short circuit impedance characteristic when the antenna is fully coupled to the RRH antenna port and having a substantially open circuit impedance characteristic (or a high resistance signal path characteristic) when the antenna is not fully coupled to the RRH antenna port. As used herein, fully coupled means the antenna is (ideally) torqued to the right tension onto the antenna port connector.

Such mechanical means protects the PA (or a series of PAs or a PA lineup) from damage by preventing or otherwise disabling the RRH from powering on and/or by alerting a controller in the RRH that or more antennas is not coupled to an antenna port of an RRH. Such mechanical means of detecting may thus lower the risk of operating an RRH with a substantially open circuit impedance (also sometimes referred to herein simply as an open connection) at the antenna port of the RRH.

Furthermore, as will be described below in conjunction with FIGS. 4 and 6, in many systems, a circulator (or other protection circuit) may be coupled between the PA and the antenna. A circulator is a magnetic RF component which may be coupled between an output port of a PA and a port of the antenna and protects the PA from exposure to excess power reflected back to the PA output port. Such a reflection of power may be caused, for example, by a high voltage standing wave ratio (VSWR) condition (such as may be caused by an open circuit impedance) existing at an antenna port of an RRH. Thus, in accordance with the concepts described herein, it has been recognized that inclusion of mechanical means of detecting an unconnected antenna at an RRH antenna port may also allow relaxation of requirements (e.g. power handling requirements) of a circulator (or other protection circuit) coupled between the PA output port and an antenna.

Thus, at least some benefits of including a mechanical means of detecting whether an antenna is electrically and/or mechanically connected to an RRH antenna port, include, but are not limited to, relaxing the requirements of a circulator (e.g. technical and/or design requirements of a circulator) coupled between a PA output port and an antenna may enable lowering the insertion loss of the circulator.

Lowering the insertion loss of a circulator in a transmit signal path, in turn, raises the efficiency of the RF transmit signal path. Lowering the insertion loss of a circulator may also reduce the need for heatsinks in the RRH since portions of insertion lass energy may manifest itself as heat in the circulator.

Since high bandwidth in RF systems typically leads to low efficiencies (e.g. circulators and other components which having relatively high insertion loss characteristics requiring relatively large (and thus heavy) heat sinks or sophisticated cooling structures and/systems which may also be relatively large ad heavy), this results in RRHs that are large, heavy, and expensive to operate. Thus, utilization of mechanical means of detecting whether an antenna is electrically and/or mechanically connected to an RRH antenna port results in an RRH which is smaller and lighter than RRHs used in systems which do not include a mechanical means of detecting whether an antenna is electrically and/or mechanically connected to an RRH antenna port.

Referring again to FIG. 1, the cellular network comprises a base station unit coupled to one or more remote radio heads (RRHs) (with two RRHs being shown in FIG. 1) which in turn are coupled to one or more handsets (with m handsets being shown in FIG. 1) through an antenna. In embodiments, the antenna may be provided as a multiple-input, multiple-output (MIMO) antenna.

Based on a measured signal-to-noise (SNR) on any given link in the cell, the upper limit of channel capacity is known (Shannon limit). Based upon a selected coding strategy implemented in the network and the measured SNR, the maximum realizable capacity may be determined. Furthermore, an actual achieved bit rate is known. From these data, it can be determined how much "excess" SNR exists (with "excess" SNR being that amount of SNR which is above the amount to needed to continue communication at the actual achieved bit rate). It has also been recognized that such excess SNR corresponds to an amount of excess transmitter power. That is, it is possible to maintain the same actual achieved bit rate while reducing the amount of transit power.

In response to a known actual bit rate achieved in a cellular network, the cellular network is configured to dynamically scale a transmitted output power (e.g. base station output power) to an amount of transmitted output power which is substantially at or near a minimum amount of transmit power needed at all times to maintain an achieved (or desired) bit rate. In this way, the power consumption of a transmit system may be reduced (or ideally minimized).

In embodiments, by transmitting an output power which is substantially at or near a minimum amount of transmit power needed to maintain the known actual bit rate, power consumption of a transmit system can be reduced below the power consumption used in a conventional system. Furthermore, by transmitting an output power which is always at or near a minimum amount of transmit power needed to always maintain the known actual bit rate, the power consumption of a transmit system may be minimized.

In embodiments, the RF lineup (and in particular the RF power amplifier in a transmit system), can be dynamically scaled to keep the efficiency high. In embodiments, a transmit system may be provided as part of a transmit-receive (T/R) circuit (i.e. a soc-called T/R module).

In embodiments, by observing long-term statistics, it is possible to design a remote radio head (RRH) and/or active antennas to have a form factor which is smaller than the form factor of a conventional RRH. This is possible since, in accordance with the concepts described herein, the RRH may be designed to satisfy needs derived from observing long-term statistics, rather than always preparing for the absolute worst case. This leads to smaller (in area and/or volume), lighter RRHs.

In embodiments, one feedback mechanism utilizes real-time measurements of SNR, bit rate, and/or achieved capacity. Designing networks, systems and components in accordance with the concepts described herein leads to an adaptable cellular network and ideally leads to a maximally adaptable cellular network.

In embodiments, one feedback mechanism is feedback based upon long-term network statistics.

In embodiments, multiple feedback mechanisms can be used. For example, in embodiments, real-time measurements of SNR and/or bit rate and/or achieved capacity and/or long-term network statistics can be used. In embodiments, the some or all of the above feedback mechanisms can be used alone or can be used in combination.

Figure 3:
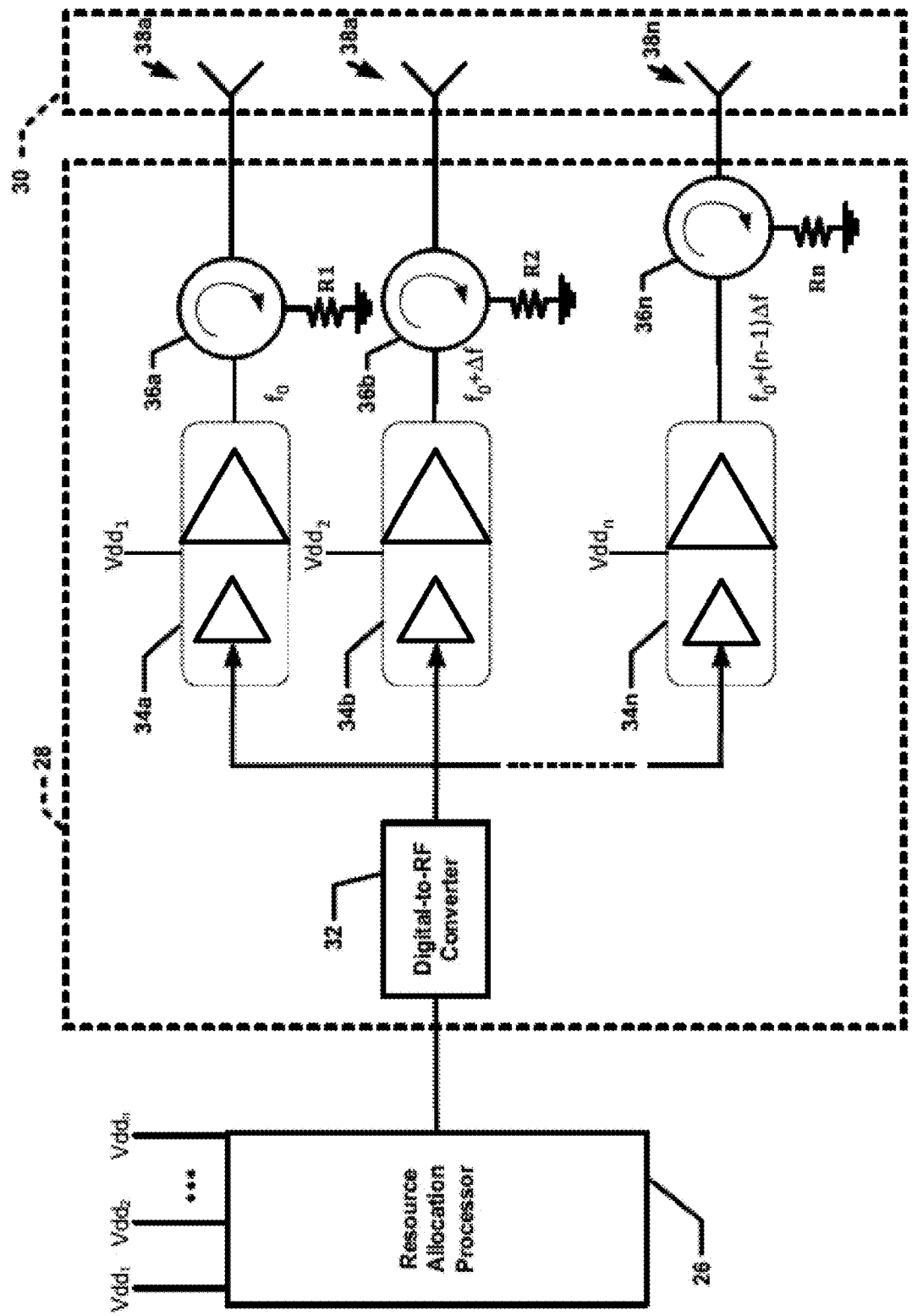
FIG. 3 is a block diagram of radio frequency (RF) power amplifier (PA) lineups for a multiple-input, multiple-output (MIMO) RRH or active antenna.

Referring now to FIG. 3, a system includes a resource allocation processor which receives all digital data to be transmitted, allocates the data to spectral ranges and provides signals (e.g. IQ signals) to a digital-to-RF converter. The resource allocation processor also receives and processes data provided to determine long-term signal statistics. In embodiments, such long-term signal statistics may include but are not limited to monitoring overall number of users; total bits/sec as a function of time in the whole network as well as over each individual link; real-time SNR in the link; effective MIMO rank.

The resource allocation processor may also provide amplifier supply voltages (e.g. Vdds) to supply terminals (or more generally bias terminals) of respective ones of a plurality of power amplifiers in response to the determined long-term signal statistics and in response thereto.

Figure 4:
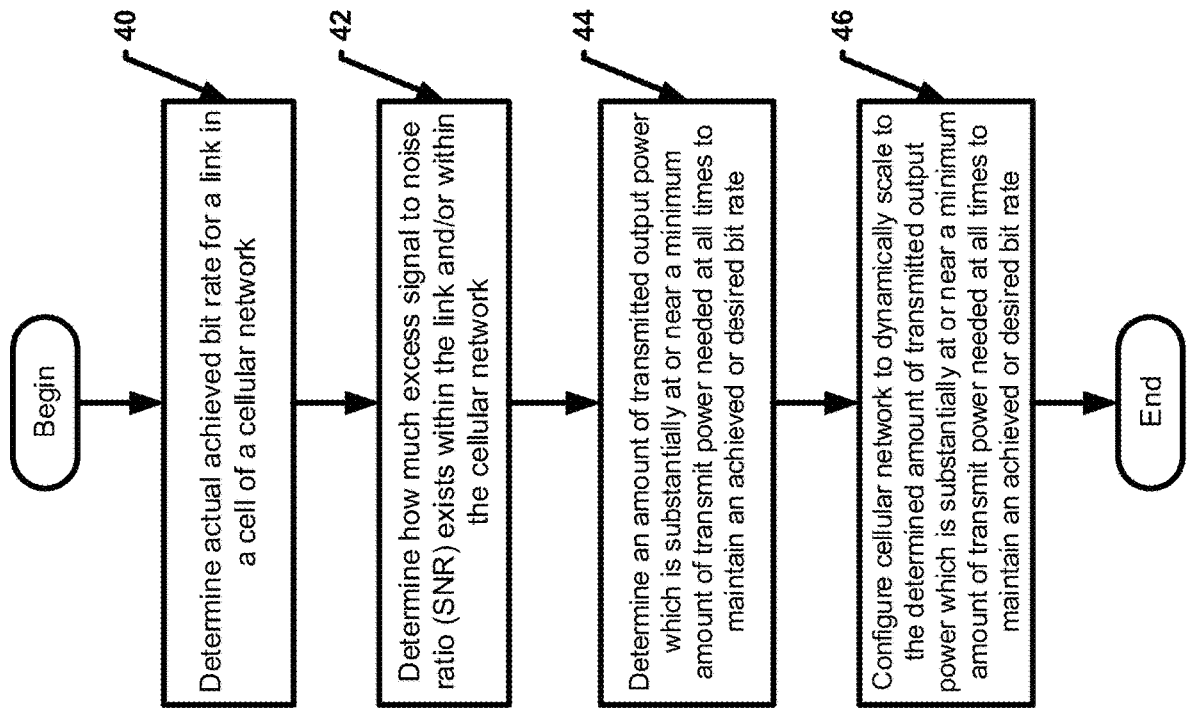
FIG. 4 is a flow diagram of a process for dynamically scaling a transmitted output power to an amount of transmitted output power which is substantially at or near a minimum amount of transmit power needed at all times to maintain a desired bit rate.

In accordance with determined signal frequencies from the resource allocation processor, the digital-to-RF converter provides appropriate RF signal to ones of a plurality of RF amplifier transmit paths (with n paths being shown in the example of FIG. 4).

Each power amplifier (PA) path may be tuned for operation at different center frequencies (e.g. frequencies at $f_0$, $f_0+\Delta f$, ... $f_0+(n-1)\Delta f$) to allow for coverage of wide aggregate bandwidths in a variety of deployed bands (channel capacity varies substantially linearly with bandwidth). In embodiments, the bandwidth of each path is chosen to allow high efficiency. When few bands are deployed, there is the option to raise amplifier supply voltages (e.g. Vdds) to keep total output power high. When many bands are deployed, PA bias voltages (e.g. PA supply voltages or Vdds) can be adjusted (e.g. lowered) to keep total output power constant.

In embodiments, MIMO rank may be increased by adding more paths at a given frequency offset.

The output of the RF amplifier paths (each of which may comprise one or more amplifying devices) is coupled through a circulator (or other protection device) to an RF port of an antenna. The circulator protects RF amplifiers in the amplifier path from RF signals received by the antenna. The RF amplifiers may be protected from signals reflected at the port of the circulator coupled to the RF amplifier output port and propagated toward the output port of the RF amplifier in a manner to be described below in conjunction with FIG. 5.

The concepts, systems and techniques described herein allow for high bandwidth, high capacity RRHs that are also small and light.

Some feedback mechanisms which can be used in accordance with the concepts, systems and techniques described herein include, but are not limited to: (1) real-time measurements of achieved bit rate, and effective MIMO rank; and long-term network statistics.

It should be noted that use of effective MIMO rank may lead to a maximally adaptable cellular network. Effective MIMO rank is the measured parallelism actually achieved with a multiple antenna transmitter/receiver pair. The number of physical antennas tells you the potential MIMO rank that the hardware can handle. When the number of antennas that you have exceeds the effective MIMO rank (which is determined by, among other things, how cluttered the propagation path is by reflective objects), then the parallelism of those extra antennas is wasted.

In embodiments, either or even multiple types of feedback may be used (either individually or in combination).

Some benefits of these concepts, systems and techniques include, but are not limited to an increase in the overall efficiency and lower the energy consumption of the RRH over its lifetime. The results in lower operating costs.

Some feedback mechanisms which can be used in accordance with the concepts, systems and techniques described herein include, but are not limited to: (1) real-time measurements of SNR, and/or monitoring the dynamic coding decisions made in the network that determine the PAPR for each RRH pipe; and/or long-term network statistics. Long-term network statistics which may be used include, but are not limited to overall network traffic volume; measured SNR in any given link, and in all links; MIMO rank achieved. Either feedback mechanism may be used individually, or these feedback mechanisms may be used in combination.

Referring now to FIG. 4, a flow diagram of a process for dynamically scaling a transmitted output power to an amount of transmitted output power which is substantially at or near a minimum amount of transmit power needed at all times to maintain a desired bit rate includes determining an actual achieved bit rate for a link in a cell of a cellular network, determining an actual achieved bit rate for a link in a cell of a cellular network, determining how much excess signal to noise ratio (SNR) exists within the link and/or within the cellular network, determining an amount of transmitted output power which is substantially at or near a minimum amount of transmit power needed at all times to maintain an achieved or desired bit rate and configuring the cellular network to dynamically scale to the determined amount of transmitted output power which is substantially at or near a minimum amount of transmit power needed at all times to maintain an achieved or desired bit rate.

Figure 5:
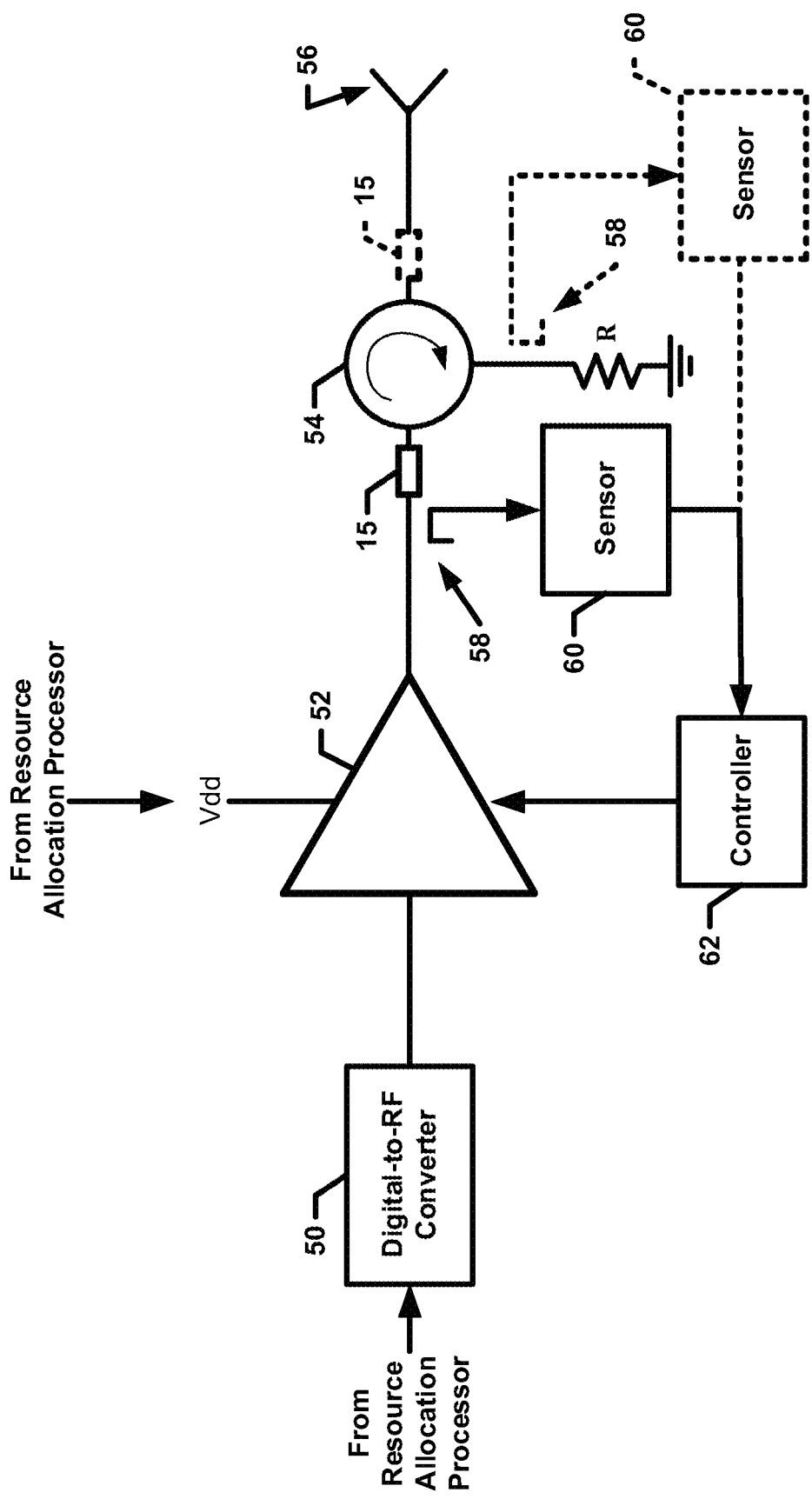
FIG. 5 is a block diagram of a senor coupled between an output of a power amplifier and a bi-directions port of an antenna.

Referring now to FIG. 5, a digital-to-RF converter provides an RF signal to an input of an RF amplifier (e.g. an RF power amplifier). The output of the RF amplifier is coupled through a circulator (or other protection device) to an RF port of an antenna. An RF coupler (or other signal sensing device) couples or otherwise detects a portion of any RF signals which are reflected from the input port of the circulator back and propagate toward the output port of the RF amplifier. Such reflected signals may be due, for example, due to an impedance mismatch between the output impedance of the RF amplifier and the input impedance of the circulator port to which the RF amplifier output port is coupled (i.e. an impedance mismatch (or difference) between the impedance at the output port of the RF amplifier and the impedance at the port of the circulator to which the RF amplifier output port is coupled).

A sensor (or detector) receives a signal from the coupler. If the magnitude of the signal received by the sensor (either in voltage or power) exceeds a predetermined threshold level, then the senor provides a signal to a controller which prevents the RF amplifier from being turned on (or if the RF amplifier is already turned on, the controller may turn off the RF amplifier. Such action(s) may be taken to prevent the RF amplifier by being damages due to exposure to an RF signal received at the RF amplifier output port (e.g. an RF signal reflected from the circulator back toward the RF amplifier.

Figure 6:
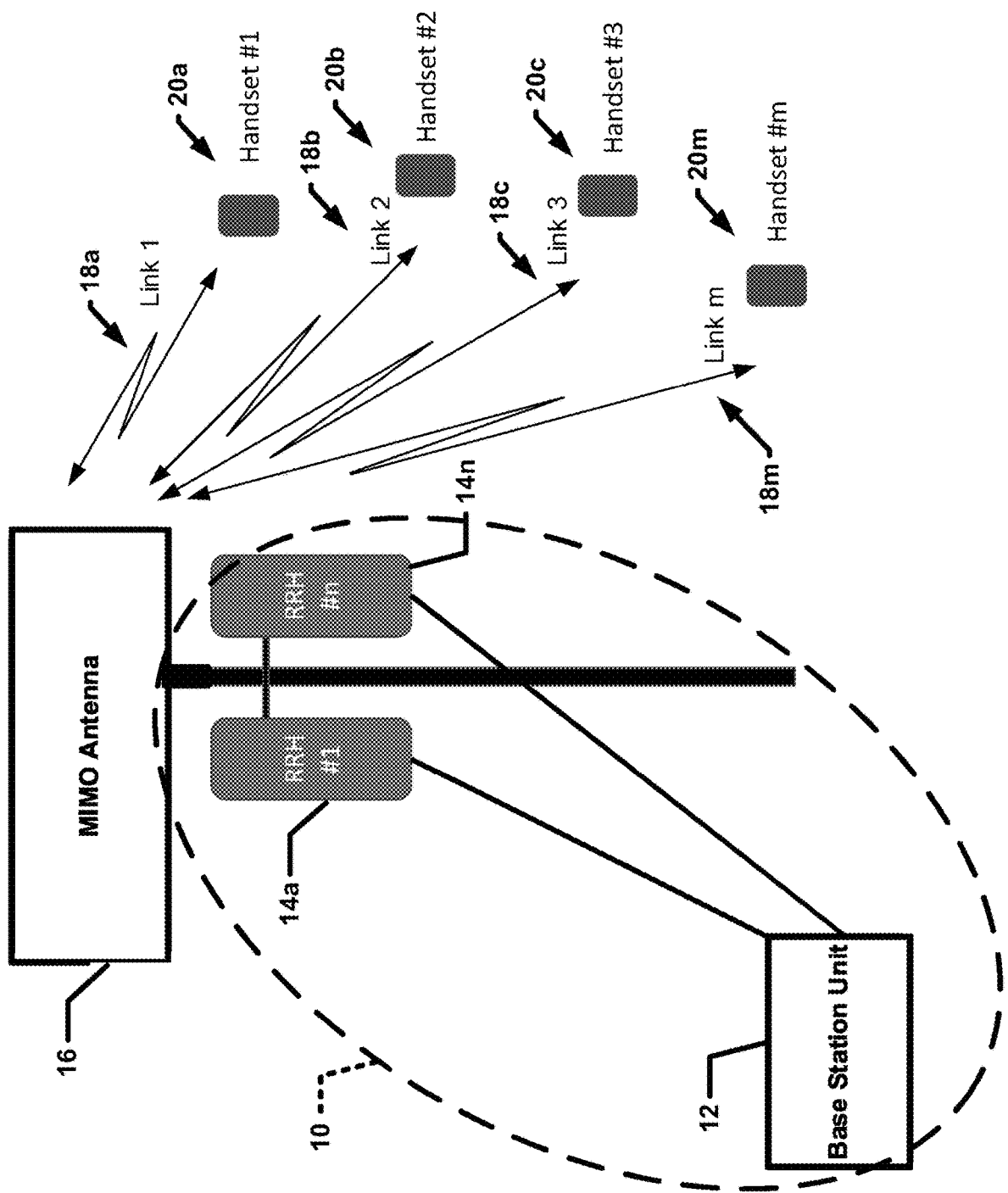
FIG. 6 is a block diagram of an architecture of a cellular network.

Referring now to FIG. 6, a cellular network includes a distributed base station comprising a base station unit (BSU) coupled to one or more remote radio heads (RRHs) (with two RRHs being shown in FIG. 6) which in turn are coupled to one or more handsets (with m handsets being shown in FIG. 6) through a multiple-input, multiple-output (MIMO) antenna system.

Based upon a measured signal-to-noise (SNR) on any given link in the cell, the upper limit of channel capacity is known (Shannon limit). Based upon a selected coding strategy implemented in the network and the measured SNR, the maximum realizable capacity may be determined. Furthermore, an actual achieved bit rate is known. From these data, it can be determined how much "excess" SNR exists (with "excess" SNR being that amount of SNR which is above the amount to needed to continue communication at the actual achieved bit rate). It has also been recognized that such excess SNR corresponds to an amount of excess transmitter power. That is, it is possible to maintain the same actual achieved bit rate while reducing the amount of transit power.

In response to a known actual bit rate achieved in a cellular network, the cellular network is configured to dynamically scale a transmitted output power of a base station (e.g. output power from an RRH) to an amount of transmitted output power which is substantially at or near a minimum amount of transmit power needed at all times to maintain an achieved (or desired) bit rate. In this way, the power consumption of a transmit system may be reduced (or ideally minimized).

In embodiments, by transmitting an output power which is substantially at or near a minimum amount of transmit power needed to maintain the known actual bit rate, power consumption of a transmit system can be reduced below the power consumption used in a conventional system. Furthermore, by transmitting an output power which is always at or near a minimum amount of transmit power needed to always maintain the known actual bit rate, the power consumption of a transmit system may be minimized.

In embodiments, the RF lineup (and in particular the RF power amplifier in a transmit system), can be dynamically scaled to keep the efficiency high. In embodiments, a transmit system may be provided as part of a transmit-receive (T/R) circuit (i.e. a soc-called T/R module).

In embodiments, by observing long-term statistics, it is possible to design a remote radio head (RRH) and/or active antennas to have a form factor which is smaller than the form factor of a conventional RRH. This is possible since, in accordance with the concepts described herein, the RRH may be designed to satisfy needs derived from observing long-term statistics, rather than always preparing for the absolute worst case. This leads to smaller (in area and/or volume), lighter RRHs.

In embodiments, one feedback mechanism utilizes real-time measurements of SNR, bit rate, and/or achieved capacity. Designing networks, systems and components in accordance with the concepts described herein leads to an adaptable cellular network and ideally leads to a maximally adaptable cellular network.

In embodiments, one feedback mechanism is feedback based upon long-term network statistics.

In embodiments, multiple feedback mechanisms can be used. For example, in embodiments, real-time measurements of SNR and/or bit rate and/or achieved capacity and/or long-term network statistics can be used. In embodiments, the some or all of the above feedback mechanisms can be used alone or can be used in combination. Bit rate, SNR, and MIMO rank are constantly being monitored in the central network, and reported out for analysis by the carriers. Thus, such data is readily available for analysis of long-term trends, and could therefore be used for dynamic adjustments.

Figure 7:
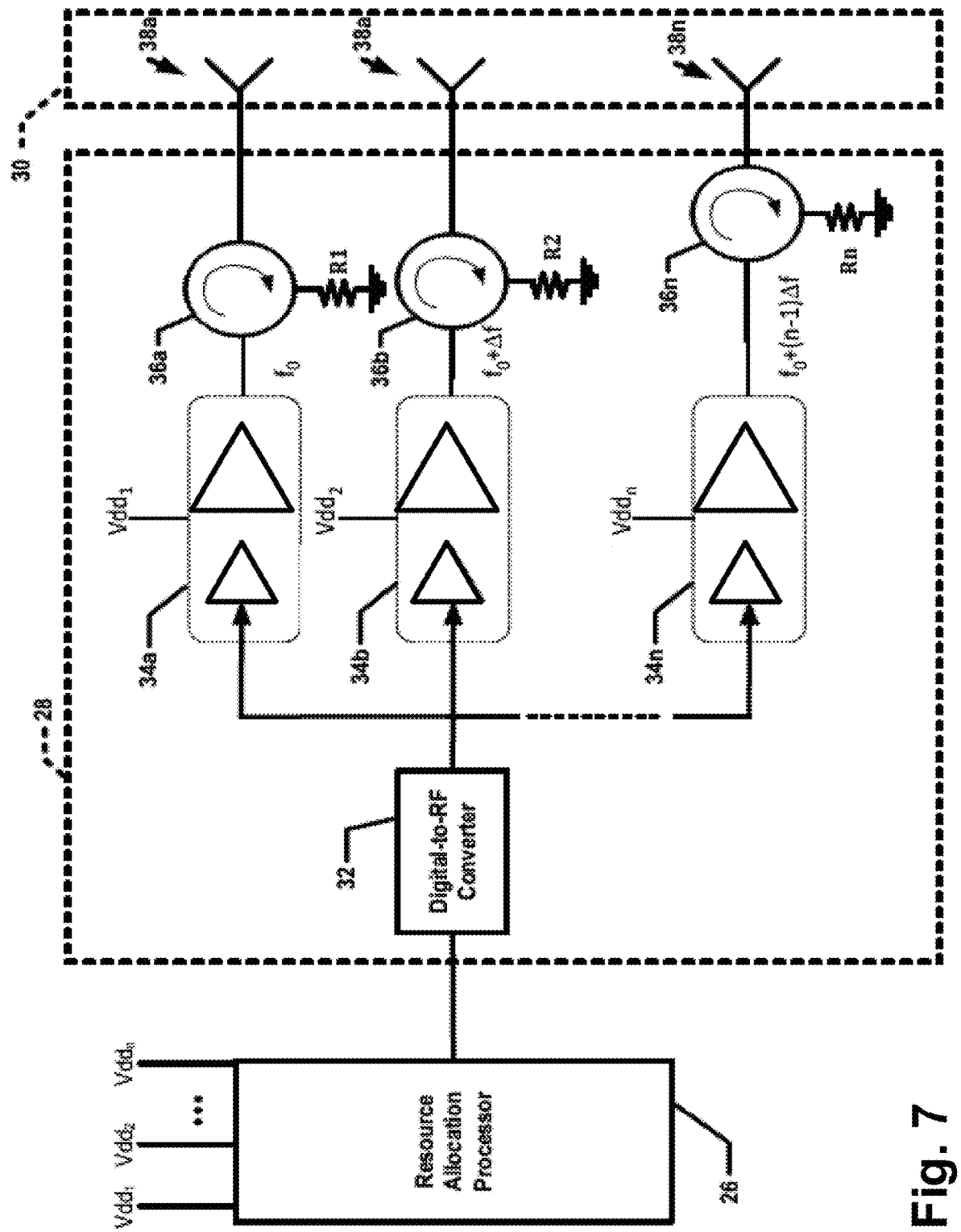
FIG. 7 is a block diagram of radio frequency (RF) power amplifier (PA) lineups for a multiple-input, multiple-output (MIMO) RRH or active antenna.

Referring now to FIG. 7, a system includes a resource allocation processor which receives all digital data to be transmitted, allocates the data to spectral ranges and provides signals (e.g. IQ signals) to a digital-to-RF converter. In some embodiments the resource allocation processor may be provided as part of an RRH and in some embodiments the resource allocation processor may be provided as part of a base station unit. The resource allocation processor also receives and processes data provided to determine long-term signal statistics. For example, a customer doing a voice call will be allocated relatively little spectrum, while a customer using a video application will need relatively more spectrum.

The resource allocation processor may also determine and/or provide amplifier supply voltages (e.g. Vdds) to supply terminals (or more generally bias terminals) of respective ones of a plurality of power amplifiers in response to the determined long-term signal statistics and in response thereto.

In accordance with determined signal frequencies from the resource allocation processor, the digital-to-RF converter provides appropriate RF signal to ones of a plurality of RF amplifier transmit paths (with n paths being shown in the example of FIG. 7).

The system divides a communication channel so that no single RF power amplifier in an RRH has to carry so much bandwidth that it cannot be efficiently operated. The maximum efficient bandwidth for the communication channel is actually determined by the design of the RF hardware. That is, for a sub-6 GHz PA, it is generally agreed that 200 MHz of bandwidth will result in low efficiency operation, while 60 MHz of bandwidth can be handled with modern devices with high efficiency. This hardware constraint determines how one divides up the communications channel. (e.g. biased in a way that the PA efficiency is relatively high compared with a maximum efficiency achievable with the PA. In embodiments, the resource allocation processor puts certain bits on PA1, PA2, etc. in accordance with the frequency slices they have been allocated.

Each power amplifier (PA) path may be tuned for operation at different center frequencies (e.g. frequencies at $f_0$, $f_0+\Delta f$, ... $f_0+(n-1)\Delta f$) to allow for coverage of wide aggregate bandwidths in a variety of deployed bands (channel capacity varies substantially linearly with bandwidth). In embodiments, the bandwidth of each path is chosen to allow high efficiency. When few bands are deployed, there is the option to raise amplifier supply voltages (e.g. Vdds) to keep total output power high. When many bands are deployed, PA bias voltages (e.g. PA supply voltages or Vdds) can be adjusted (e.g. lowered) to keep total output power constant. In embodiments, MIMO rank may be increased by adding more paths at a given frequency offset.

The output of the RF amplifier paths (each of which may comprise one or more amplifying devices) is coupled through a circulator (or other protection device) to an RF port of an antenna. The circulator protects RF amplifiers in the amplifier path from RF signals received by the antenna.

By dividing a communication channel so that no single RF power amplifier in an RRH has to carry so much bandwidth that it cannot be efficiently operated and by tuning each power amplifier (PA) path for different center frequencies, to allow for coverage of wide aggregate frequency bandwidths in a variety of deployed frequency bands, it is possible to provide RRHs having a frequency bandwidth and a capacity which is higher than conventional RRHs. Furthermore, RRHs provided in accordance with the concepts and techniques described herein are smaller and lighter than conventional RRHs.

Some feedback mechanisms which can be used in accordance with the concepts, systems and techniques described herein include, but are not limited to: (1) real-time measurements of achieved bit rate, and effective MIMO rank; and long-term network statistics.

It should be noted that use of effective MIMO rank may lead to a maximally adaptable cellular network.

In embodiments, either or even multiple types of feedback may be used (either individually or in combination).

Some benefits of these concepts, systems and techniques include, but are not limited to an increase in the overall efficiency and lower the energy consumption of the RRH over its lifetime. The results in lower operating costs.

Some feedback mechanisms which can be used in accordance with the concepts, systems and techniques described herein include, but are not limited to: (1) real-time measurements of SNR, and/or monitoring the dynamic coding decisions made in the network that determine the PAPR for each RRH pipe; and/or long-term network statistics. Either feedback mechanism may be used individually, or these feedback mechanisms may be used in combination.

Each power amplifier (PA) path may be tuned for different center frequencies, to allow for coverage of wide aggregate bandwidths in a variety of deployed bands (channel capacity always goes linearly with bandwidth). In embodiments, the bandwidth of each path is chosen to allow high efficiency. When few bands are deployed, there is the option to raise amplifier supply voltages (e.g. Vdds) to keep total output power high. When many bands are deployed, PA bias voltages (e.g. PA supply voltages or Vdds) can be adjusted (e.g. lowered) to keep total output power constant. In embodiments, MIMO rank may be increased by adding more paths at a given frequency offset.

The concepts, systems and techniques described herein allow for high bandwidth, high capacity RRHs that are also small and light.

Some feedback mechanisms which can be used in accordance with the concepts, systems and techniques described herein include, but are not limited to: (1) real-time measurements of achieved bit rate, and effective MIMO rank (this leads to a maximally adaptable cellular network); and long-term network statistics. In embodiments, either or even multiple types of feedback may be used (either individually or in combination).

Some benefits of these concepts, systems and techniques include, but are not limited to an increase in the overall efficiency and lower the energy consumption of the RRH over its lifetime. The results in lower operating costs.

Some feedback mechanisms which can be used in accordance with the concepts, systems and techniques described herein include, but are not limited to: (1) real-time measurements of SNR, and/or monitoring the dynamic coding decisions made in the network that determine the PAPR for each RRH pipe; and/or long-term network statistics. Either feedback mechanism may be used or these feedback mechanisms may be used in combination.

It should be noted that in embodiments, the antenna system may be provided as part of the RRH.

Figure 8:
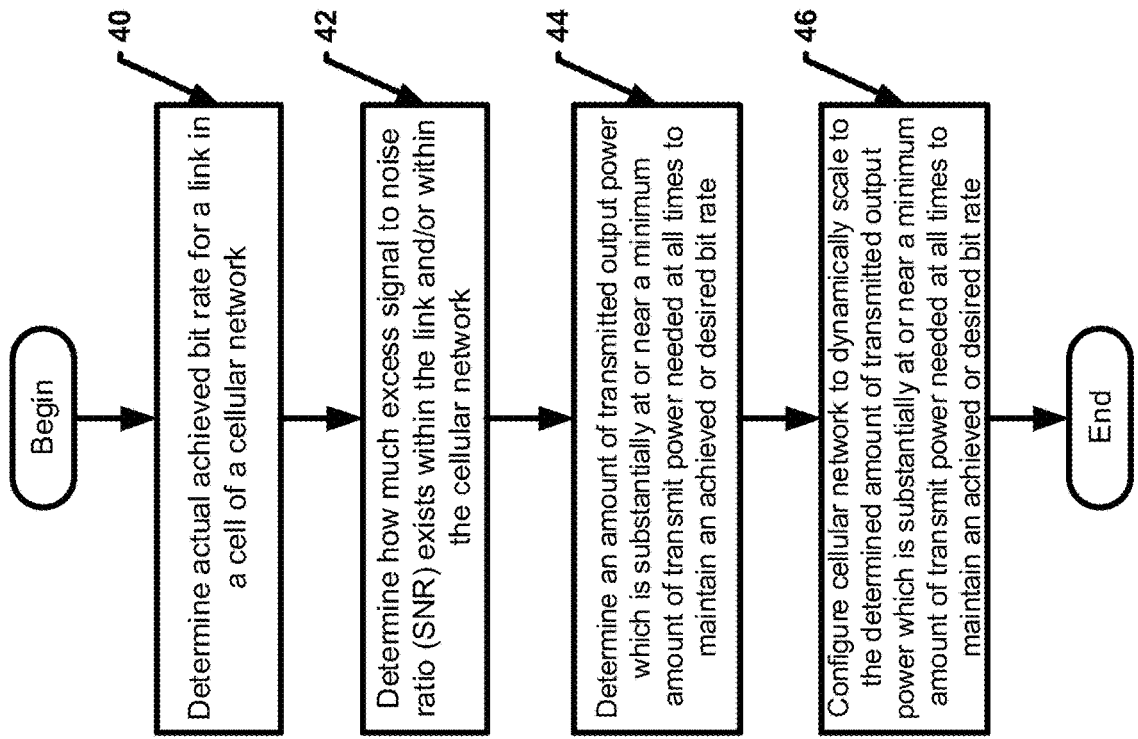
FIG. 8 is a flow diagram of a process for dynamically scaling a transmitted output power to an amount of transmitted output power which is substantially at or near a minimum amount of transmit power needed at all times to maintain a desired bit rate.

FIG. 8 is a flow diagram showing illustrative processing that can be implemented within the system of FIGS. 6 and 7 (e.g. via the base station unit and/or the resource allocation processor). Rectangular elements (typified by element 40 in FIG. 3, denoted as "processing blocks," represent computer software instructions or groups of instructions. Alternatively, the processing and decision blocks may represent functions performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated, the particular sequence of blocks described is illustrative only and can be varied without departing from the spirit of the concepts, structures, and techniques described. Thus, unless otherwise stated the blocks described below are unordered meaning that, when possible, the functions represented by the blocks can be performed in any convenient or desirable order.

Turning now to FIG. 8, a flow diagram of a process for dynamically scaling a transmitted output power to an amount of transmitted output power which is substantially at or near a minimum amount of transmit power needed at all times to maintain a desired bit rate includes determining an actual achieved bit rate for a link in a cell of a cellular network (40), determining how much excess signal to noise ratio (SNR) exists within the link and/or within the cellular network (42), determining an amount of transmitted output power which is substantially at or near a minimum amount of transmit power needed at all times to maintain an achieved or desired bit rate (44) and configuring the cellular network to dynamically scale to the determined amount of transmitted output power which is substantially at or near a minimum amount of transmit power needed at all times to maintain an achieved or desired bit rate (46).

Figure 9:
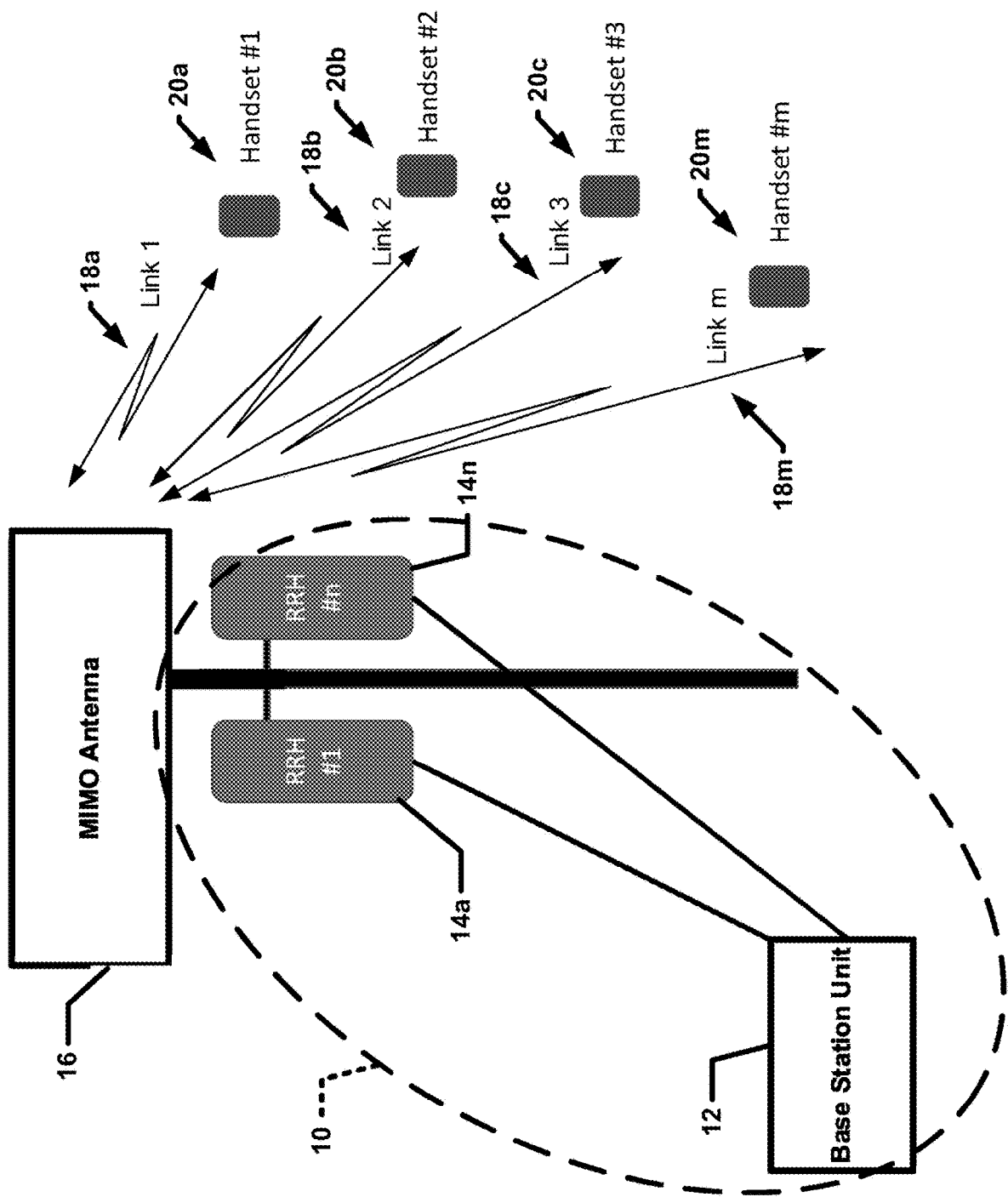
FIG. 9 illustrates an architecture of a cellular network.

Referring now to FIG. 9, a cellular network comprises a distributed base station 10 have a base station unit 12 communicatively coupled to one or more remote radio heads (RRHs) 14 (with two RRHs 14a, 14n being explicitly shown in FIG. 9). RRHs may contain radio frequency (RF) circuitry in addition to analog-to-digital converters (ADCs) or digital-to-analog converters (DACs) and frequency translation circuits (e.g., up/down converters such as RF mixers).

RRHs 14 may be coupled to base station unit 15 using wireless techniques (e.g. microwave, millimeter wave (MMW), free space optics (FSO) links or using hard wire techniques (e.g., fiber optic cable).

In turn, the RRH units 14 are coupled to one or more mobile communication devices (with m such devices 20a-20m being shown in FIG. 9) though corresponding communications links 18a-18m. The mobile communication devices may correspond to handsets (e.g smart phones, (including but not limited to iPhones, Android mobiles), tablet computers or any other type of mobile communication device. RF signals (e.g. transmit signals) generated via the RRHs are emitted though antenna 16 and an RF signals provided by handsets 20 are received through antenna 16 and coupled to one or more RRHs. In embodiments, antenna 16 is provided having a substantially omnidirectional antenna pattern. In embodiments, antenna 16 may be provided as a multiple-input, multiple-output (MIMO) antenna. In embodiments, antenna 16 may be provided as a MIMO antenna having a substantially omnidirectional antennas pattern. In embodiments, antenna 16 may be integrated with RRH 14. The base station unit and RRHs are operable with as GSM, CDMA, UMTS, LTE, 4G, 5G, 6G technologies.

Based on a measured signal-to-noise (SNR) on any given link in a cell (e.g. one of links 36a-36d in cell 32a of FIG. 11), the upper limit of channel capacity is known (Shannon limit). Based upon a selected coding strategy implemented in the network and the measured SNR, the maximum realizable capacity may be determined. Furthermore, an actual achieved bit rate is known. From these data, it can be determined how much "excess" SNR exists (with "excess" SNR being that amount of SNR which is above the amount to needed to continue communication at the actual achieved bit rate). It has also been recognized that such excess SNR corresponds to an amount of excess transmitter power. That is, it is possible to maintain the same actual achieved bit rate while reducing the amount of transit power.

In response to a known actual bit rate achieved in a cellular network, the cellular network is configured to dynamically scale a transmitted output power (e.g. base station output power) to an amount of transmitted output power which is substantially at or near a minimum amount of transmit power needed at all times to maintain an achieved (or desired) bit rate. In this way, the power consumption of a transmit system may be reduced (or ideally minimized). Thus, the base station comprises a controller (e.g. a processor) capable of receiving data provided thereto and in response thereto scaling a transmitted output power of the base station such that the base station provides an amount of transmitted output power which is substantially at or near a minimum amount of transmit power needed at all times to maintain an achieved (or desired) bit rate.

In embodiments, by transmitting an output power which is substantially at or near a minimum amount of transmit power needed to maintain the known actual bit rate, power consumption of a transmit system can be reduced below the power consumption used in a conventional system. Furthermore, by transmitting an output power which is always at or near a minimum amount of transmit power needed to always maintain the known actual bit rate, the power consumption of a transmit system may be minimized.

In embodiments, the RF lineup (and in particular the RF power amplifier in a transmit system), can be dynamically scaled to keep the efficiency high. In embodiments, a transmit system may be provided as part of a transmit-receive (T/R) circuit (i.e. a soc-called T/R module).

In embodiments, by observing long-term statistics (e.g. SNR, bit rate, and/or achieved capacity), it is possible to design a remote radio head (RRH) and/or active antennas to have a form factor which is smaller than the form factor of a conventional RRH. This is possible since, in accordance with the concepts described herein, the RRH may be designed to satisfy needs derived from observing long-term statistics, rather than always preparing for the absolute worst case. This leads to smaller (in area and/or volume), lighter RRHs.

In embodiments, one feedback mechanism utilizes real-time measurements of SNR, bit rate, and/or achieved capacity. Designing networks, systems and components in accordance with the concepts described herein leads to an adaptable cellular network and ideally leads to a maximally adaptable cellular network.

In embodiments, one feedback mechanism is feedback based upon long-term network statistics.

In embodiments, multiple feedback mechanisms can be used. For example, in embodiments, real-time measurements of SNR and/or bit rate and/or achieved capacity and/or long-term network statistics can be used. In embodiments, the some or all of the above feedback mechanisms can be used alone or can be used in combination.

Figure 10:
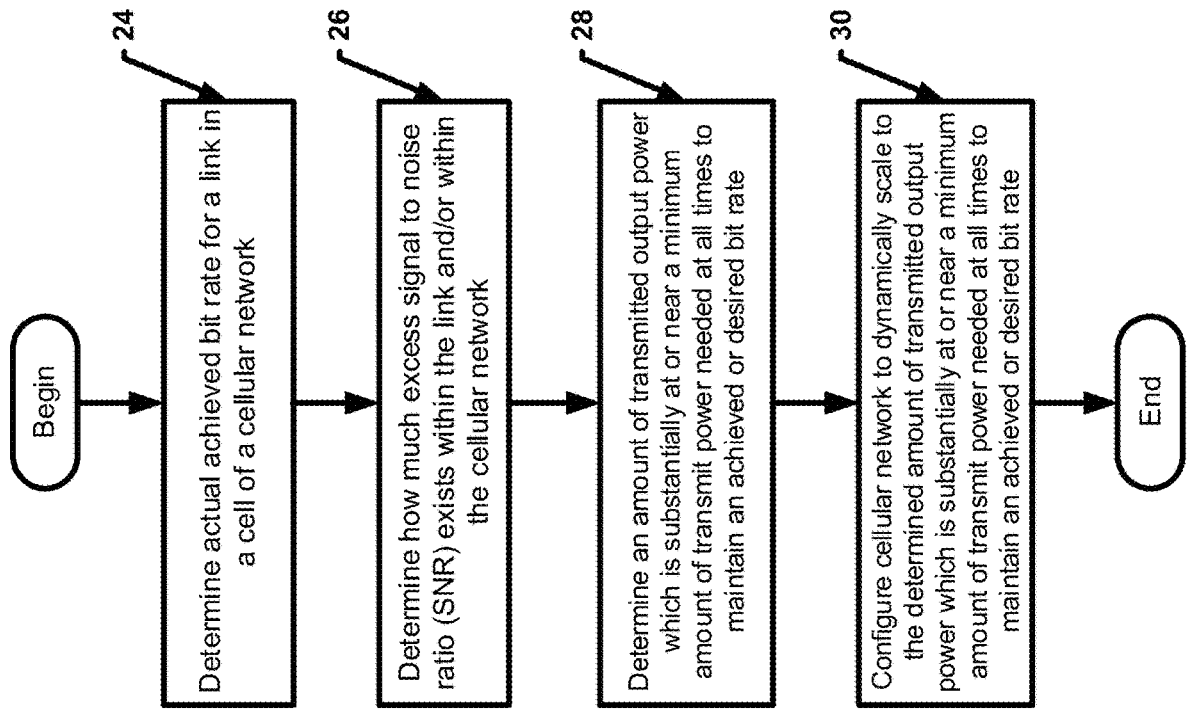
FIG. 10 is a flow diagram of a process for dynamically scaling a transmitted output power to an amount of transmitted output power which is substantially at or near a minimum amount of transmit power needed at all times to maintain a desired bit rate.

FIG. 10 is a flow diagram showing illustrative processing that can be implemented within the system of FIG. 9. Rectangular elements (typified by element 24 in FIG. 10, denoted as "processing blocks," represent computer software instructions or groups of instructions. Alternatively, the processing and decision blocks may represent functions performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated, the particular sequence of blocks described is illustrative only and can be varied without departing from the spirit of the concepts, structures, and techniques described. Thus, unless otherwise stated the blocks described below are unordered meaning that, when possible, the functions represented by the blocks can be performed in any convenient or desirable order.

Turning now to FIG. 10, a flow diagram of a process for dynamically scaling a transmitted output power to an amount of transmitted output power which is substantially at or near a minimum amount of transmit power needed at all times to maintain a desired bit rate includes determining an actual achieved bit rate for a link in a cell of a cellular network, determining an actual achieved bit rate for a link in a cell of a cellular network, determining how much excess signal to noise ratio (SNR) exists within the link and/or within the cellular network, determining an amount of transmitted output power which is substantially at or near a minimum amount of transmit power needed at all times to maintain an achieved or desired bit rate and configuring the cellular network to dynamically scale to the determined amount of transmitted output power which is substantially at or near a minimum amount of transmit power needed at all times to maintain an achieved or desired bit rate.

As used herein, a desired bit rate may be understood as follows. The carrier decides, based on extensive link budget analysis, what bit rate it wants to support at a given time and in a given location. Margin is built into this, so that if, for example, the SNR in the channel suddenly improves, the system may not automatically alter its transmission strategy to increase the bit rate. In this case we have "excess" SNR, which is another way of saying that in this circumstance, the system is transmitting more power than needed for the given bit rate.

With respect to the difference between determining excess SNR within the link vs. determining excess SNR within the cell, this concept may be understood as follows. If the discussion is limited to excess SNR within each link, that is sufficient and accurate. For managing the whole network, it is helpful if the central network control knows the excess SNR of all of the links, meaning every connection between a base station and a user, so that it can make global power allocation decisions.

With respect to how one would configure the cellular network to dynamically scale the transmitted output power, if it is determined that a given base station transmitter is providing "excess SNR" of 1 dB (for example), then the output power is scaled down in response by 1 dB (and ideally, by exactly 1 dB). Configuring the network means making such adjustments for all of the base station transmitters in the network.

Figure 11:
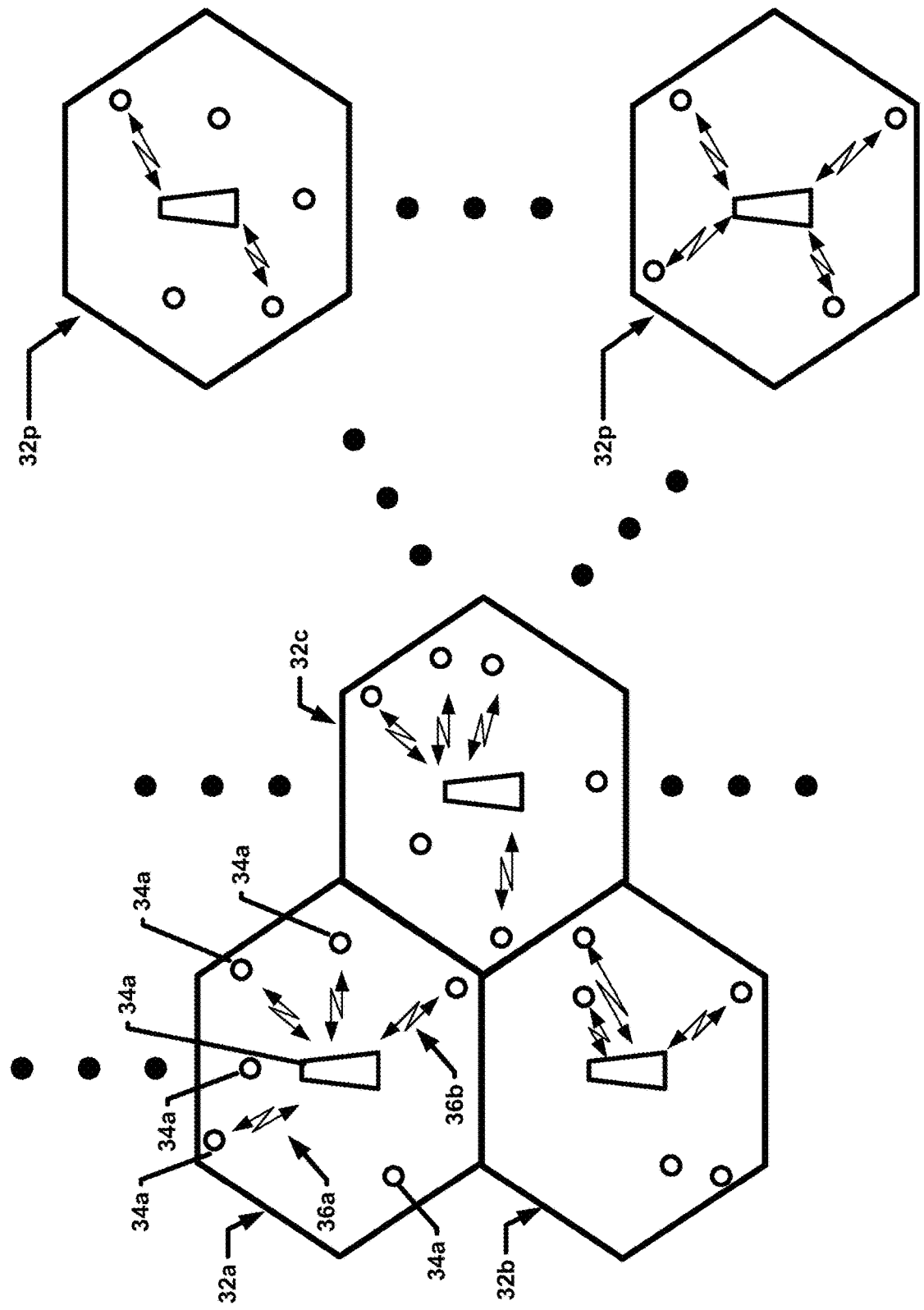
FIG. 11 is a block diagram of a network having multiple cells.

Referring now to FIG. 11, a cellular network comprises a plurality of cells with each cell comprising one or more base stations and each base station coupled to one or more radio heads. In this illustrative embodiment, cellular network is illustrated as a GSM cellular network in which cells are deployed in substantially uniform hexagons with having a cell tower with at least one base station unit and one or more RRHs. RRHs may be located substantially at the center of each cell and have omnidirectional antennas. The one or more base stations and radio heads may be the same as or similar to the base station and radio heads described above in conjunction with at least FIGS. 9 and 10.

Although reference is made herein to particular systems or configurations, it is appreciated that other systems or configurations having similar functional and/or structural properties may be substituted where appropriate, and that a person having ordinary skill in the art would understand how to select such systems or configurations and incorporate them into embodiments which incorporate the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A remote radio head (RRH) comprising:
    a plurality of RF power amplifier (PA) transmit paths, each of the plurality of RF amplifier transmit paths including at least one RF power amplifier; and
    means for dividing a communication channel such that each RF power amplifier operates over a frequency bandwidth which allows efficient operation of the RF power amplifier and wherein each power amplifier (PA) transmit path is tuned for operation at a respective one of a plurality of different center frequencies ($f_0$, $f_0+\Delta f$, ... $f_0+(n-1)\Delta f$ where n is an integer corresponding to the number of RF PA transmit paths and $\Delta f$ is a frequency offset.

2. The remote radio head of claim 1 further comprising means for increasing RF PA supply voltages to one or more RF power amplifiers in response to decreasing a number of deployed frequency bands.

3. The remote radio head of claim 1 further comprising means for decreasing RF PA supply voltages to one or more RF power amplifiers in response to increasing a number of deployed frequency bands.

4. The remote radio head of claim 1 further comprising means for providing RF PA supply voltages having voltage levels selected in accordance with the number of deployed frequency bands.

5. A remote radio head (RRH) comprising:
a plurality of RF power amplifier (PA) transmit paths, each of the plurality of RF amplifier transmit paths including at least one RF power amplifier; and
means for dividing a communication channel such that each RF power amplifier operates over a frequency bandwidth selected to allow efficient operation of the RF power amplifier and wherein each PA transmit path is tuned for operation at a respective one of a plurality of different center frequencies ($f_0$, $f_0+\Delta f$, ... $f_0+(n-1)\Delta f$) where n is an integer corresponding to the number of RF PA transmit paths and $\Delta f$ is a frequency offset.

6. The remote radio head of claim 5 further comprising means for providing RF PA supply voltages having voltage levels selected in accordance with the number of deployed frequency bands.

7. The remote radio head of claim 6 further comprising means for increasing RF PA supply voltages provided to each of the PAs in deployed signal paths as the number of deployed frequency bands decreases.

8. The remote radio head of claim 6 further comprising means for decreasing RF PA supply voltages provided to each of the PAs in deployed signal paths as the number of deployed frequency bands increases.

* * * * *